(12) United States Patent
Jin et al.

(10) Patent No.: US 9,589,996 B2
(45) Date of Patent: Mar. 7, 2017

(54) DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Huijun Jin, Shanghai (CN); Dongliang Dun, Shanghai (CN); Xin Xu, Shanghai (CN); Wantong Shao, Shanghai (CN); Chen Chen, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/738,751

(22) Filed: Jun. 12, 2015

(65) Prior Publication Data
US 2015/0287751 A1 Oct. 8, 2015

Related U.S. Application Data

(62) Division of application No. 14/465,574, filed on Aug. 21, 2014.

(30) Foreign Application Priority Data

Apr. 2, 2014 (CN) .......................... 2014 1 0134480

(51) Int. Cl.
*H01L 21/84* (2006.01)
*H01L 27/12* (2006.01)
*H01L 49/02* (2006.01)

(52) U.S. Cl.
CPC ........ *H01L 27/1255* (2013.01); *H01L 27/124* (2013.01); *H01L 27/1248* (2013.01);
(Continued)

(58) Field of Classification Search
CPC ............... G02B 6/0083; G02F 1/13454; G02F 1/136213; G09G 3/3648; G09G 3/3655;
(Continued)

(56) References Cited

U.S. PATENT DOCUMENTS

| 6,046,547 | A | 4/2000 | Nishio et al. |
| 2006/0072061 | A1* | 4/2006 | Hector .................. G02F 1/1345 349/152 |

(Continued)

FOREIGN PATENT DOCUMENTS

| CN | 103163699 A | 6/2013 |
| DE | 69219230 T2 | 10/1997 |

(Continued)

OTHER PUBLICATIONS

Office Action as issued in corresponding German Application No. 102014112932.6, dated Jul. 22, 2015, and its accompanying English translation.

*Primary Examiner* — Pamela E Perkins
(74) *Attorney, Agent, or Firm* — Alston & Bird LLP

(57) ABSTRACT

A method for manufacturing a display device includes providing a first substrate, forming at least one first capacitor on the first substrate, providing a second substrate having a gate drive element formed thereon, and bonding the first substrate in alignment with the second substrate.

6 Claims, 10 Drawing Sheets

(52) U.S. Cl.
CPC ...... *H01L 27/1259* (2013.01); *H01L 27/1288* (2013.01); *H01L 28/60* (2013.01)

(58) Field of Classification Search
CPC ... G09G 2300/0408; G09G 2300/0804; G09G 2310/0286; H01L 27/1235; H01L 27/124; H01L 27/3244; H01L 27/3246
See application file for complete search history.

(56) References Cited

U.S. PATENT DOCUMENTS

| | | |
|---|---|---|
| 2008/0218650 A1 | 9/2008 | Koshihara et al. |
| 2010/0193778 A1 | 8/2010 | An et al. |
| 2012/0218198 A1 | 8/2012 | Shin et al. |

FOREIGN PATENT DOCUMENTS

| | | | |
|---|---|---|---|
| DE | 102005020939 A1 | | 4/2006 |
| DE | 202012103377 U1 | | 11/2012 |
| DE | 102013216824 A1 | | 3/2014 |
| JP | 2013005542 | * | 1/2013 |
| KR | 100950228 A | | 3/2010 |
| WO | 2004051355 A1 | | 6/2004 |
| WO | WO 2004/051355 | * | 6/2004 |

\* cited by examiner

DISPLAY DEVICE

CROSS-REFERENCES TO RELATED APPLICATIONS

The present application is a divisional application of U.S. application Ser. No. 14/465,574, filed Aug. 21, 2014, the entire content of which is incorporated herein by reference for all purposes. The U.S. application Ser. No. 14/465,574 claims the benefit and priority of Chinese patent application No. 201410134480.0, entitled "DISPLAY DEVICE", filed with the State Intellectual Property Office of People's Republic of China on Apr. 2, 2014, the content of which is incorporated herein by reference in its entirety.

FIELD OF THE INVENTION

The present invention relates to the field of display technologies, and more particularly to a display device.

BACKGROUND OF THE INVENTION

Display panels have been widely applied to handsets, Personal Digital Assistants (PDAs) and other portable electronic products. Examples of display panels are Thin Film Transistor-Liquid Crystal Display (TFT-LCD), Organic Light Emitting Diode (OLED) display, Low Temperature Poly-Silicon (LTPS) display, Plasma Display Panel (PDP), etc. Increasing market competition has resulted in the development of a more portable display device with superior display effect at a lower cost. In recent years, the traditional practice of driving a pixel by an external gate drive chip has been gradually replaced by the practice of fabricating a gate drive circuit structure directly on a display panel, wherein this gate drive circuit is referred to as a Gate on Array (GOA) circuit. The use of GOA technology can eliminate a drive IC and make the display panel lighter and reduce the cost effectively and can improve the reliability of the display. Thus in recent years the GOA technology has gradually become a focus of research and development.

FIG. 1A is a principle diagram of a gate drive circuit in the prior art. As illustrated in FIG. 1A, the function of the gate drive circuit is to generate a pulse at a fixed timing sequence, wherein the pulse is transmitted to a thin film transistor display panel so as to control a thin film transistor in a pixel to be turned on and off. The gate drive circuit generally includes a plurality of signal lines, a plurality of thin film transistors, a capacitor and a wire. The GOA circuit is disposed in a non-display area on the periphery of a display device, and in order to reduce the delay of a signal, there is wider wiring and also possibly a capacitor component to alleviate a threshold voltage offset and other problems so as to improve the display performance of the display device. As illustrated in FIG. 1B, the capacitor component is typically fabricated on a glass substrate 100 through a data line metal pattern 102 and a gate metal pattern 101, and an insulation layer 104 between them, thus resulting in a hunk of metal in the GOA circuit. When a sealant is cured through UV irradiating, since the sealant corresponds to a GOA circuit area, in order to cure the sealant sufficiently, the capacitor component at a GOA circuit layer is typically designed with metal holes 103, as illustrated in FIG. 1C, to thereby obtain a sufficient transmissivity in UV curing process of the sealant, but this design may result in increasing the width of the GOA circuit layer and further increasing the width of a frame edge of the display device, thus failing to narrow the frame edge.

There is wide wiring of the gate drive circuit in the prior art, and the capacitor component at the gate drive circuit layer is typically designed to be hollow, but this design may result in increasing the width of the circuit layer, thus failing to narrow the frame edge.

BRIEF SUMMARY OF THE INVENTION

In view of this, the present invention provides a display device and a method for manufacturing the display device.

In order to address the foregoing technical problem, an embodiment of the present invention provides a display device, which includes: a first substrate; a second substrate disposed opposite to the first substrate; and a gate drive circuit including at least one first capacitor and a gate drive element, wherein the first capacitor is located on the first substrate, and the gate drive element is disposed on the second substrate.

An embodiment of the present invention provides a method for manufacturing a display device, the method includes the following steps: providing a first substrate including at least one first capacitor; providing a second substrate including a gate drive element; and bonding the first substrate in alignment with the second substrate.

As compared with the prior art, with the display device according to the embodiment of the present invention, the capacitor of the gate drive circuit is disposed on the first substrate, and the other gate drive element is disposed opposite to the second substrate, thereby reducing the overall area of wiring of the gate drive circuit and narrowing a frame edge of the display device.

BRIEF DESCRIPTION OF THE DRAWINGS

In order to describe the technical solutions in the embodiments of the present invention more clearly, the drawings to be used in a description of the embodiments will be briefly introduced below, and apparently the drawings to be described below are merely illustrative of some of the many specific embodiments of the present invention. Those ordinarily skilled in the art can readily derive other arrangements without departing from the scope of the invention.

DETAILED DESCRIPTION OF THE INVENTION

The technical solutions according to the embodiments of the present invention will be described clearly and completely with reference to the drawings in the embodiments of the present invention. Apparently, the described embodiments are just a portion the embodiments of the present invention, not all of the embodiments of the present invention. Based upon the embodiments of the present invention, all of other embodiments derived by those ordinarily skilled in the art without any inventive effort shall come into the scope of the present invention.

Figure 1A:
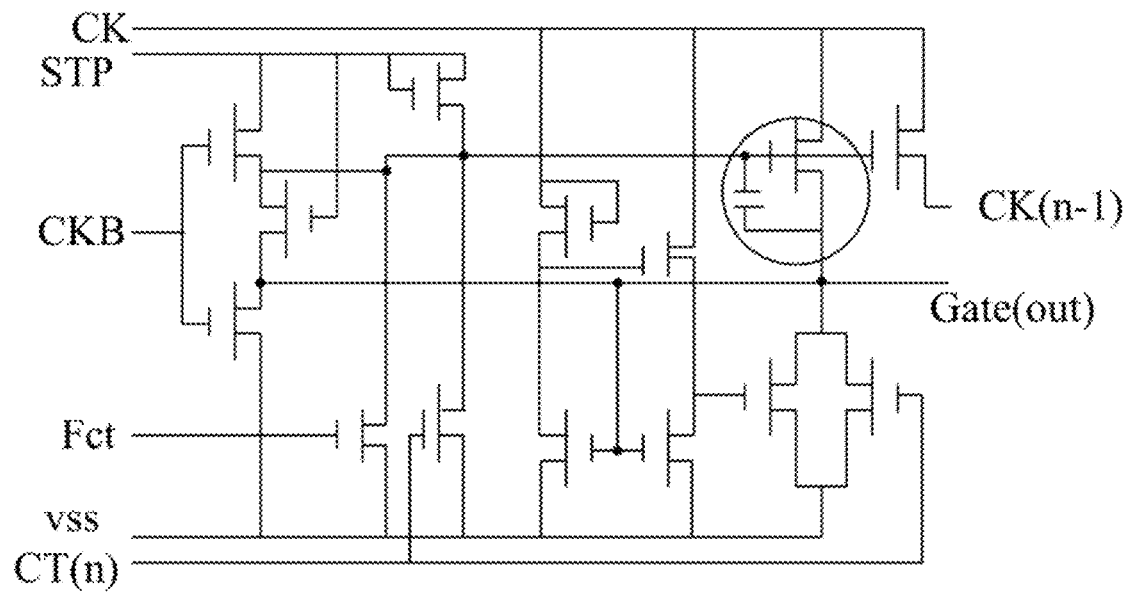
FIG. 1A is a principle diagram of a gate drive circuit in the prior art.
Figure 1B:
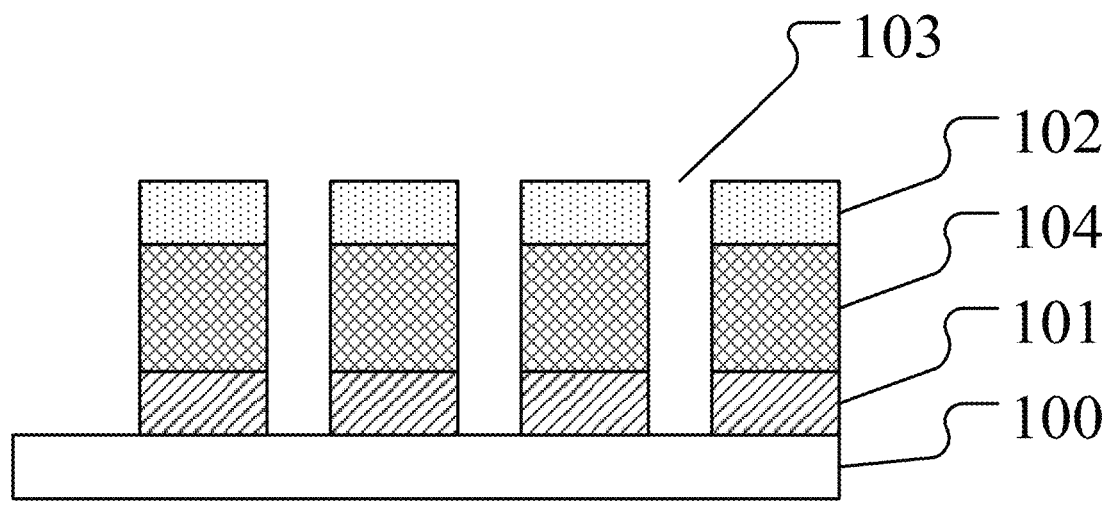
FIG. 1B is a sectional view of a capacitor of the gate drive circuit in the prior art.
Figure 1C:
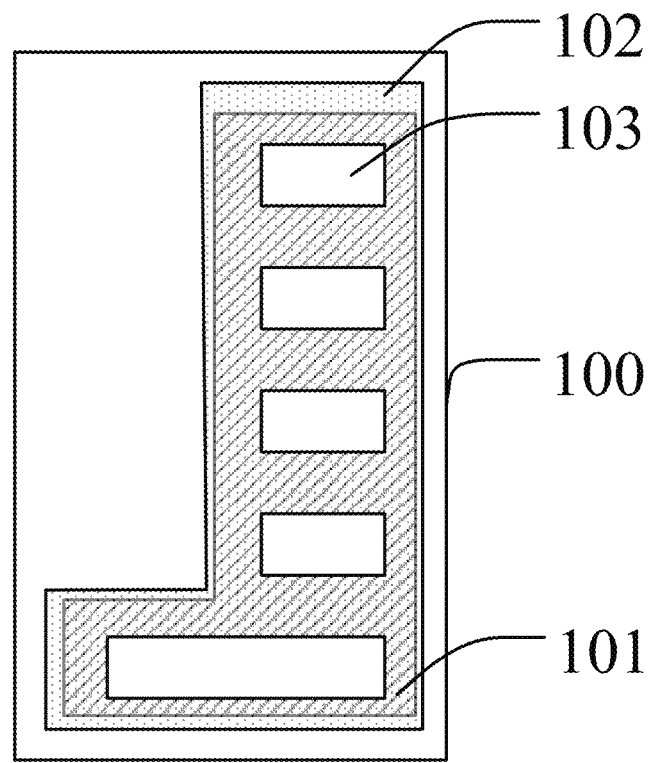
FIG. 1C is a plan view of the capacitor of the gate drive circuit in the prior art.
Figure 2:
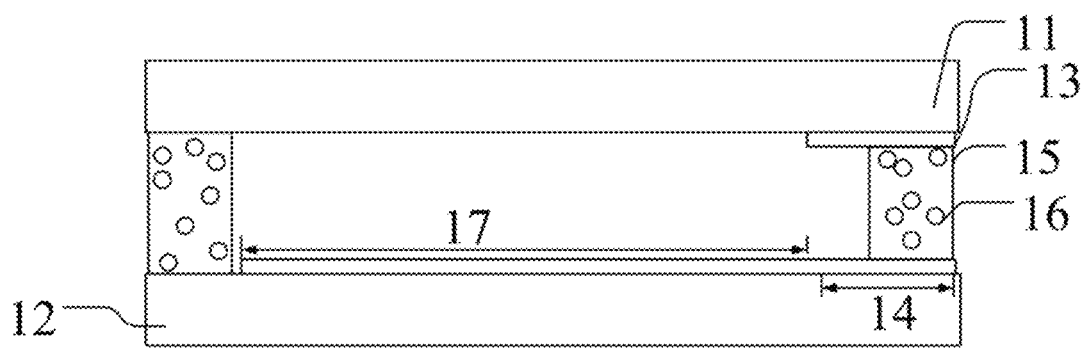
FIG. 2 is a sectional view of a display device provided by an embodiment of the present invention.

FIG. 2 illustrates a sectional view of a display device provided by an embodiment of the present invention. As illustrated in FIG. 2, the display device includes a first substrate 11, a second substrate 12 disposed opposite to the first substrate 11, and a gate drive circuit including at least one first capacitor 13 and a gate drive element 14, wherein the first capacitor 13 is disposed on the first substrate 11, and the gate drive element 14 is disposed on the second substrate 12. In an embodiment, both the first capacitor 13 and the gate drive element 14 are located in a non-display area and disposed substantially in corresponding locations with respect to each other, therefore, compared with the prior art where the first capacitor and the gate drive element are disposed on the same substrate, the arrangement according to the embodiment of the present invention reduces the wiring space of the gate drive circuit on the second substrate, for the purpose of narrowing a frame edge of the display device. A thin film transistor drive layer 17 is further disposed on the second substrate 12. An electrically conductive sealant 15 is further provided between the first substrate 11 and the second substrate 12, wherein the electrically conductive sealant 15 is disposed in the non-display area, particularly disposed between the first capacitor 13 and the gate drive element 14. The electrically conductive sealant 15 is electrically conductive, and through electrically conductive gold balls 16 doped in the electrically conductive sealant 15, when the first substrate 11 is bonded in alignment with the second substrate 12, the electrically conductive gold balls 16 therein are pressed into contact with each other to electrically connect the first capacitor 13 together with the gate drive element 14. A black matrix layer and a color resist layer (not illustrated in the figure) are further disposed on the first substrate 11 to thereby make the display device in color.

Figure 3:
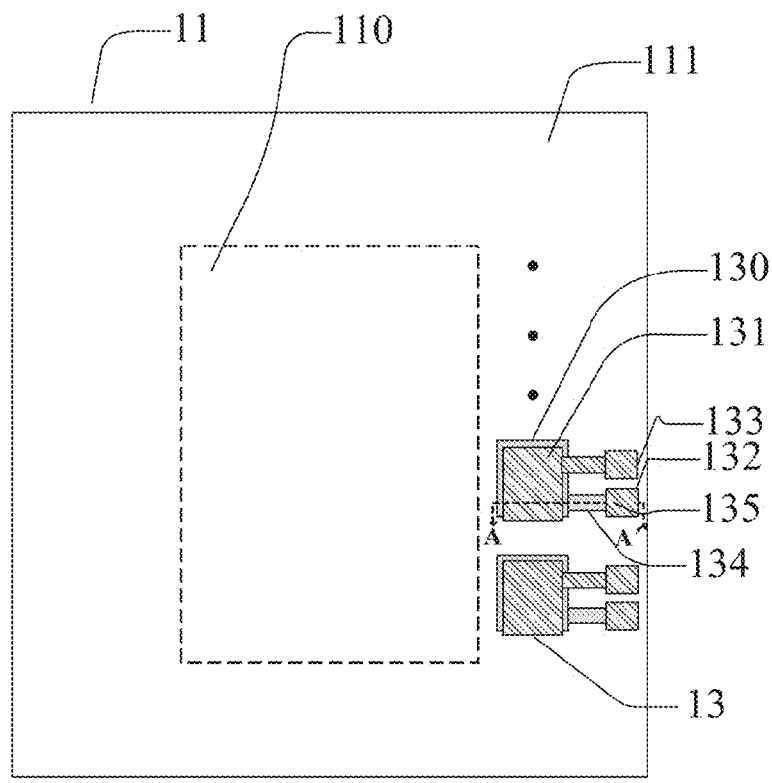
FIG. 3 is a plan view of a first substrate of the display device provided by an embodiment of the present invention.

FIG. 3 is a plan view of the first substrate of the display device provided by an embodiment of the present invention. As illustrated in FIG. 3, the first substrate 11 includes a display area 110 and a non-display area 111, wherein at least one first capacitor (referred to as "the first capacitor" hereinafter) 13 is disposed in the non-display area 111. The first capacitor 13 includes a first pole plate 130 and a second pole plate 131 disposed opposite to each other, and a first insulation layer (not illustrated in the figure) disposed between the first pole plate 130 and the second pole plate 131, and further includes a first connection pad 132 and a second connection pad 133, both of which are disposed in the same layer as the second pole plate 131, and a capacitor connection line 134 is disposed in the same layer as the first pole plate 130. The first connection pad 132 is electrically connected with the capacitor connection line 134 via a first via hole 135, the capacitor connection line 134 is electrically connected with the first pole plate 130, and the second connection pad 133 is electrically connected with the second pole plate 131. The display area 110 of the first substrate 11 further includes a black matrix layer and a color resist layer (not illustrated in the figure).

Figure 5A:
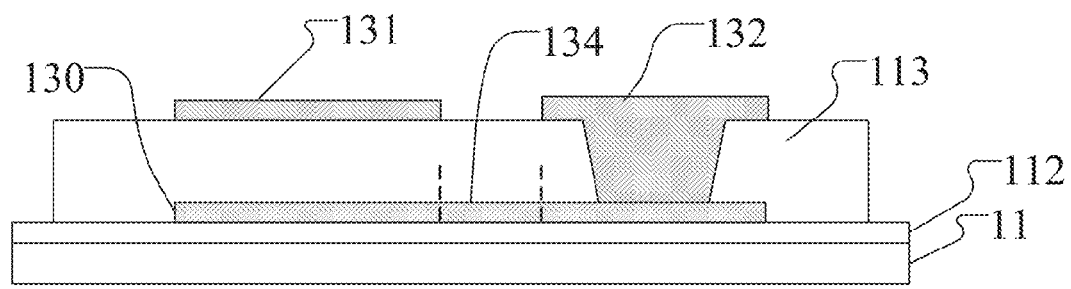
FIG. 5A is a sectional view of a cross-section taken along the line A-A' in FIG. 3.

FIG. 5A is a sectional view of a cross-section taken along the line A-A' in FIG. 3, and as can be apparent from both FIG. 3 and FIG. 5A, the black matrix 112 is disposed on the first substrate 11, the first capacitor 13 is formed on the black matrix 112, the first capacitor 13 includes the first pole plate 130 and the second pole plate 131 disposed in opposition thereto, the first insulation layer 113 which can be a color resist layer is disposed between the first pole plate 130 and the second pole plate 131, wherein the capacitor connection line 134 is dotted in FIG. 5A. The first pole plate 130 overlaps entirely with the second pole plate 131, wherein the first pole plate 130 and the second pole plate 131 are made of transparent electrode layers, and the first pole plate 130 disposed to overlap entirely with the second pole plate 131 can increase the capacitance value of the first capacitor 13.

It shall be noted that the first pole plate 130 can alternatively overlap with a portion of the second pole plate 131 as needed for a practical panel design. The first pole plate 130 and the second pole plate 131 can be made of any selected electrode layer material, for example, the first pole plate 130 is made of a transparent electrode layer, and the second pole plate 131 is made of a nontransparent electrode layer; or the first pole plate 130 is made of a nontransparent electrode layer, and the second pole plate 131 is made of a transparent electrode layer or a nontransparent electrode layer. The material of the transparent electrode layer can be Indium Tin Oxide (ITO), Indium Zinc Oxide (IZO), Indium Tin Zinc Oxide (ITZO), Antimony Tin Oxide (ATO), etc., and the material of the nontransparent electrode layer can be Silver (Ag), Gold (Au), Tungsten (W), Titanium (Ti), Molybdenum (Mo), etc. The first pole plate and/or the second pole plate made of the transparent electrode layer can be fabricated in the same process as the transparent electrode layer of the display area to thereby reduce the steps in the fabrication process, save materials and reduce costs; and the first pole plate and/or the second pole plate made of the nontransparent electrode layer can be made of metal, for example, to thereby improve the electric conductivity of the pole plate(s).

Figure 5B:
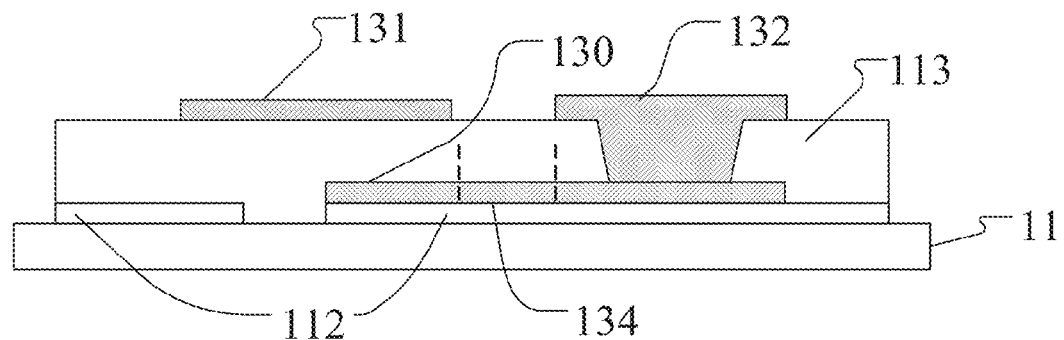
FIG. 5B is another sectional view of a first capacitor of the first substrate provided by an embodiment of the present invention.

The foregoing is merely one of embodiments of the present invention, and FIG. 5b illustrates an alternative structure, wherein the black matrix 112 can be disposed on the first substrate 11 to be hollow around the display area, that is, the black matrix in the display area is spaced from the black matrix in the non-display area. As illustrated in FIG. 3 as well, in the non-display area 111, the first pole plate 130 is disposed on the black matrix 112 of the non-display area to overlap with a portion of the second pole plate 131, and such a hollow design of the black matrix at the edge of a screen can protect against electrostatic occurrence.

Figure 5C:
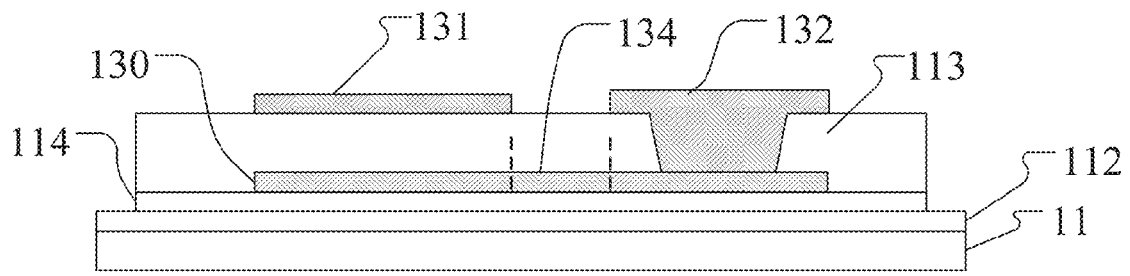
FIG. 5C is another sectional view of the first capacitor of the first substrate provided by an embodiment of the present invention.

FIG. 5C illustrates another implementation of an embodiment, wherein a fourth insulation layer 114 can be disposed between the black matrix 112 and the first pole plate 130 to overlie the black matrix 112 uniformly; and the fourth insulation layer 114 can protect against electric conductivity; and an insulation layer or an alignment film (not illustrated in the figure) can further be disposed above the second pole plate 130, wherein the capacitor connection line 134 is dotted in FIG. 5C.

Figure 6:
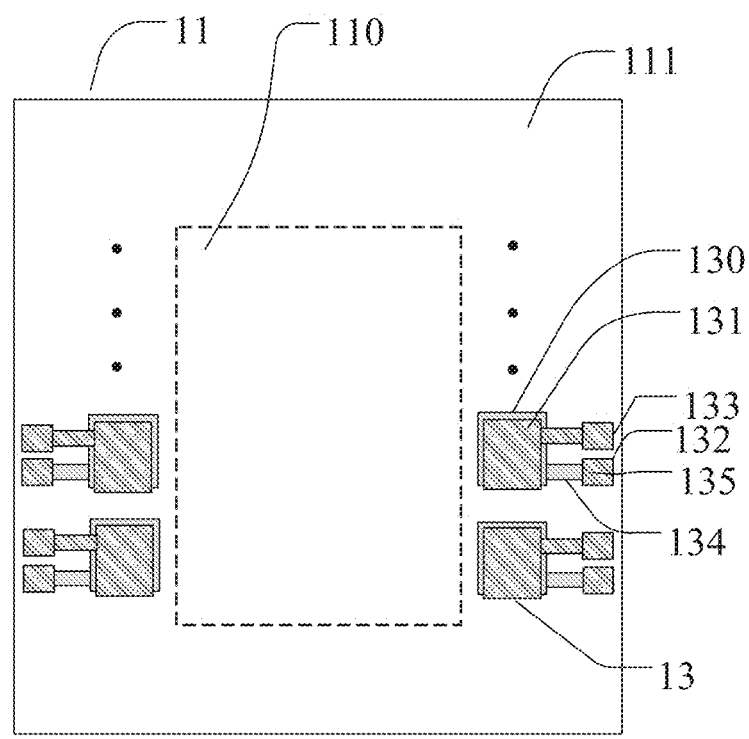
FIG. 6 is another plan view of the first substrate of the display device provided by an embodiment of the present invention.

As illustrated in FIG. 3, at least one first capacitor 13 is disposed in the non-display area 111 on a side of the display area 110 of the first substrate of the display device in this embodiment. As illustrated in FIG. 6, at least one first capacitor 13 can be further disposed in the non-display area 111 on both sides of the display area 110 of the first substrate 11.

Figure 4:
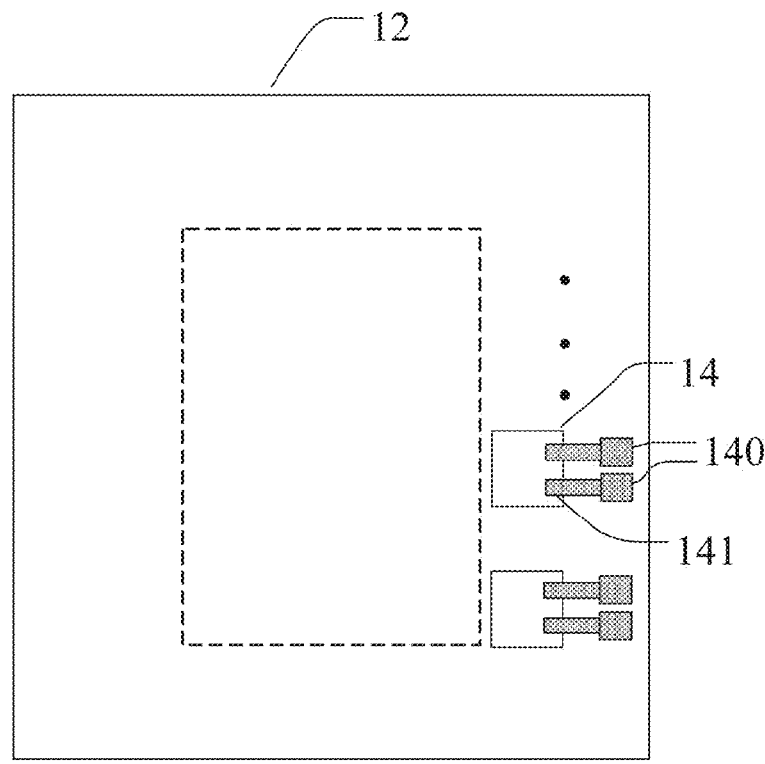
FIG. 4 is a plan view of a second substrate of the display device according to an embodiment of the present invention.

FIG. 4 is a plan view of the second substrate of the display device provided by an embodiment of the present invention. As illustrated in FIG. 4, in correspondence to the first substrate 11, the second substrate 12 also includes the display area 110 and the non-display area 111, wherein the gate drive element 14 and a third connection pad 140 are disposed in the non-display area 111, and the third connection pad 140 is electrically connected with the gate drive element 14 through a second via hole 141. The gate drive element 14 includes a plurality of thin film transistors and circuit connection lines (not illustrated in the figure). A thin film transistor drive layer 17 (not illustrated in the figure) is disposed in the display area 110, wherein the thin film transistor drive layer 17 includes thin film transistors, data lines, scan lines and other elements. The gate drive element 14 can be fabricated in the same process and made of the same material as the thin film transistor drive layer 17.

In an embodiment of the present invention, the location of the third connection pad 140 of the gate drive element on the second substrate 12 corresponds to the locations of the first connection pad 132 and the second connection pad 133 on the first substrate 11, and the third connection pad 140 of the gate drive element on the second substrate 12 is electrically connected through the sealant 15 with the first connection pad 132 and the second connection pad 133 on the first substrate 11. When the display device is in operation, the first capacitor 13 is connected onto the circuit connection line of the gate drive element 14 to provide the required capacitance for the gate drive circuit.

Figure 7:
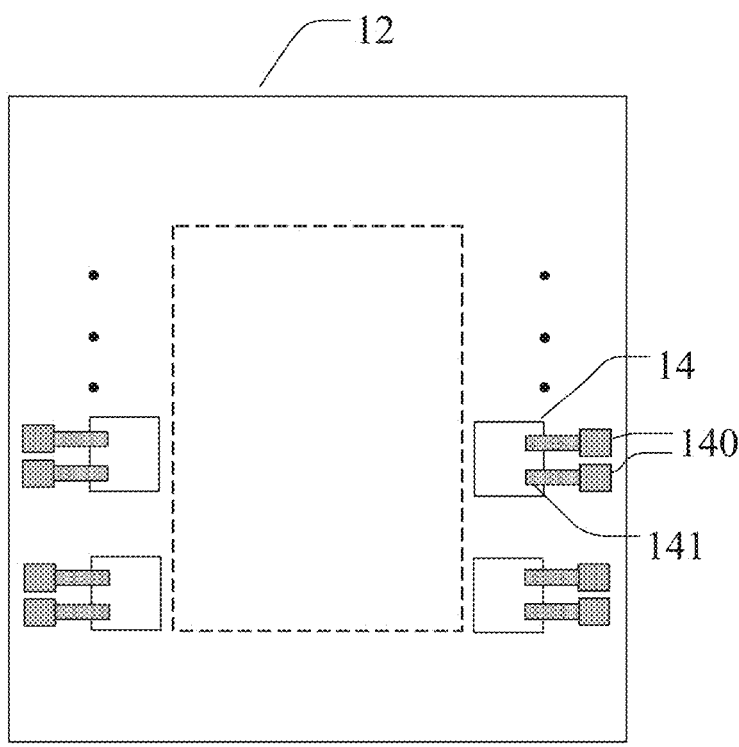
FIG. 7 is another plan view of the second substrate of the display device provided by an embodiment of the present invention.

As illustrated in FIG. 4, the gate drive element 14 is disposed in the non-display area 111 on a side of the display area 110 of the second substrate 12 of the display device in an embodiment. In addition to this, the gate drive element 14 can be further disposed in the non-display area 111 on both sides of the display area 110 of the second substrate 12, as illustrated in FIG. 7.

The materials of the gate drive element and the thin film transistor drive layer will not be limited to an oxide semiconductor, low temperature poly-silicon, amorphous silicon or another semiconductor. Moreover, an application of the display device in an embodiment will not be limited to an Organic Light Emitting Diode (OLED), a liquid crystal display device, an electronic paper (e-paper), etc.

Figure 8:
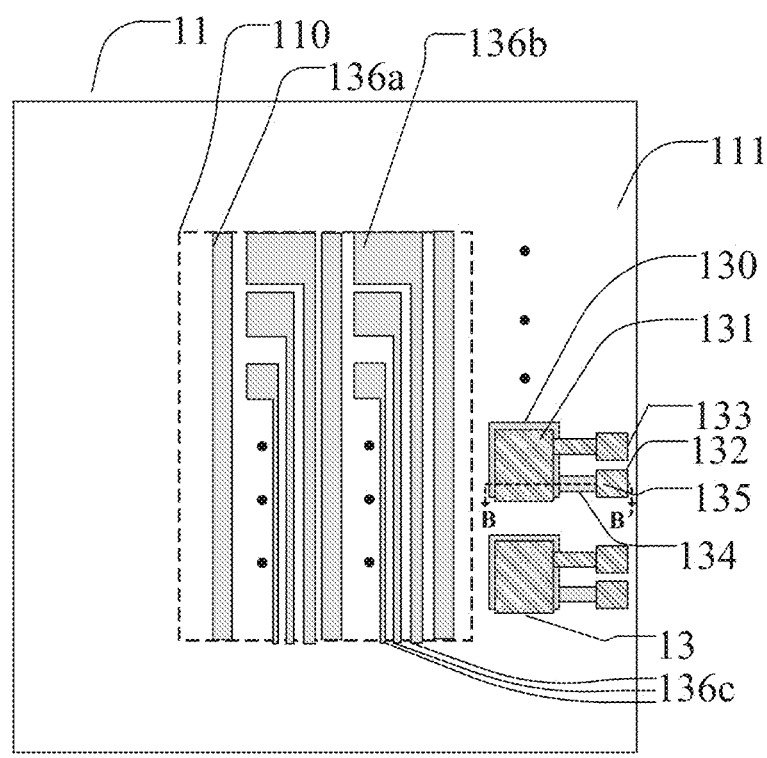
FIG. 8 is a plan view of a first substrate of a display device provided by another embodiment of the present invention.
Figure 9:
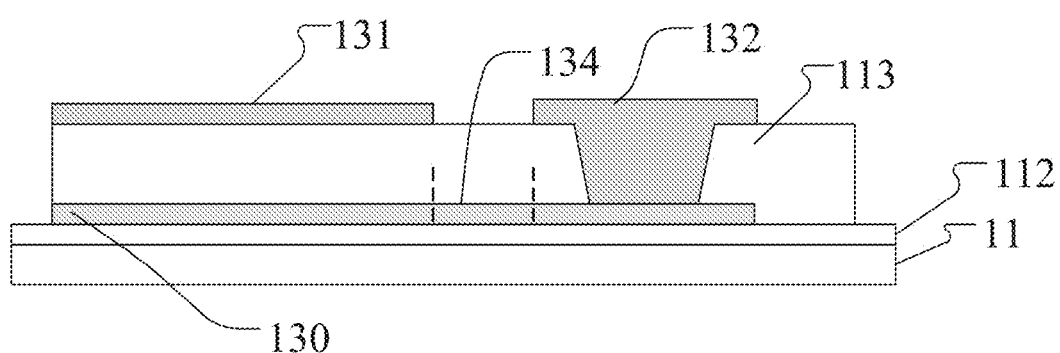
FIG. 9 is a sectional view of a cross-section taken along the line B-B' in FIG. 8.

FIG. 8 is a plan view of a first substrate of a display device provided by another embodiment of the present invention, and FIG. 9 is a sectional view taken along the line B-B' in FIG. 8. As can be apparent from both FIG. 8 and FIG. 9, the embodiment is different from the embodiment described in FIG. 3, that is, the display area 110 of the first substrate 11 of the display device further includes a first electrically conductive layer 136; and the first capacitor 13 including the first pole plate 130, the first insulation layer 113 and the second pole plate 131 is disposed in the non-display area 111 of the first substrate 11. In the embodiment, the first electrically conductive layer 136 is a single-layer touch electrode layer, and as illustrated in FIG. 8, the touch electrode layer includes a drive electrode 136a, a sense electrode 136b and an electrode lead 136c. The first electrically conductive layer 136 is disposed in the same layer as the first pole plate 130 and separate from the first pole plate 130, wherein the capacitor connection line 134 is dotted in FIG. 9. The materials of the first electrically conductive layer 136, the first pole plate 130 and the second pole plate 131 can be Indium Tin Oxide (ITO), Indium Zinc Oxide (IZO), Indium Tin Zinc Oxide (ITZO), Antimony Tin Oxide (ATO), Silver (Ag), Gold (Au), Tungsten (W), Titanium (Ti), Molybdenum (Mo), etc.; and the foregoing is merely one of implementations of an embodiment, and in an alternative implementation of the embodiment, the first electrically conductive layer 136 can alternatively be disposed in the same layer as the second pole plate 131 and spatially and electrically separate from the second pole plate 131. In the embodiment, the first pole plate and/or the second pole plate can be fabricated in the same process as the single-layer touch electrode layer of the display area to thereby reduce the steps in fabrication process, save materials and reduce costs; and the first pole plate and/or the second pole plate made of the nontransparent electrode layer can be made of metal, for example, to thereby improve the electric conductivity of the pole plate(s).

Figure 10:
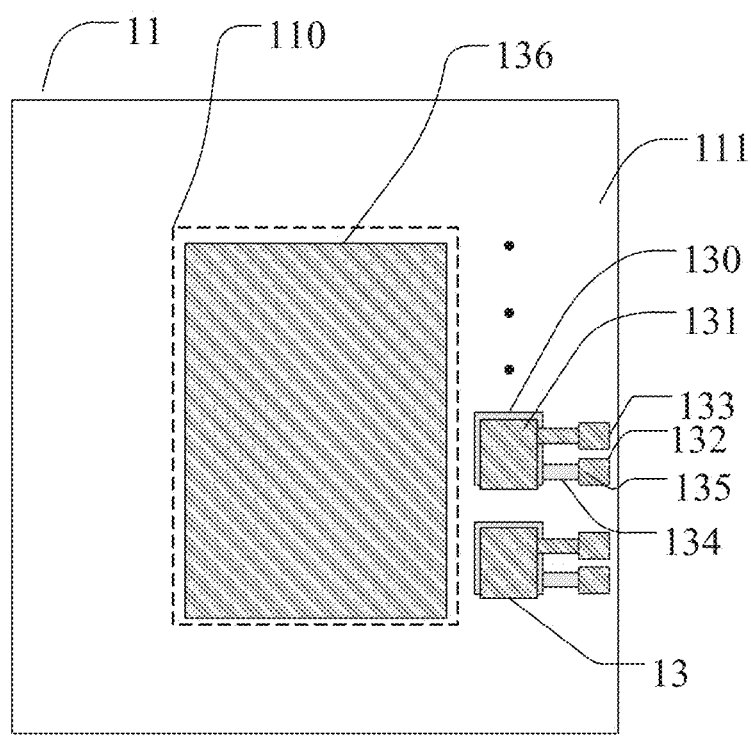
FIG. 10 is another plan view of the first substrate of the display device provided by another embodiment of the present invention.

The foregoing is merely one of implementations of an embodiment, and in an alternative implementation of the embodiment, as illustrated in FIG. 10, the first electrically conductive layer 136 is a common electrode layer, the first electrically conductive layer 136 is disposed in the same layer as the first pole plate 130 and separates from the first pole plate 130. The material of the first electrically conductive layer 136 can be Indium Tin Oxide (ITO), Indium Zinc Oxide (IZO), Indium Tin Zinc Oxide (ITZO), Antimony Tin Oxide (ATO), etc.; and the first electrically conductive layer 136 can be made of the transparent electrode layer to thereby increase the transmissivity and improve the contrast ratio of the display device. The materials of the first pole plate 130 and the second pole plate 131 can be Indium Tin Oxide (ITO), Indium Zinc Oxide (IZO), Indium Tin Zinc Oxide (ITZO), Antimony Tin Oxide (ATO), Silver (Ag), Gold (Au), Tungsten (W), Titanium (Ti), Molybdenum (Mo), etc.; and the foregoing is merely one of implementations of an embodiment, and in an alternative implementation of the embodiment, the first electrically conductive layer 136 can alternatively be disposed in the same layer as the second pole plate 131. In the foregoing embodiment, the first electrically conductive layer 136 can alternatively be an electrostatic shielding layer. The first pole plate and/or the second pole plate made of the transparent electrode layer can be fabricated in the same process as the common electrode layer or the electrostatic shielding layer of the display area to thereby reduce the steps in fabrication process, save materials and reduce costs.

In this embodiment, the single-layer touch electrode layer or the common electrode layer can be used as the first electrically conductive layer disposed in the same layer as one of the pole plates of the first capacitor to thereby save the process steps and the materials and simplify the operations and also narrow the frame edge.

Figure 11:
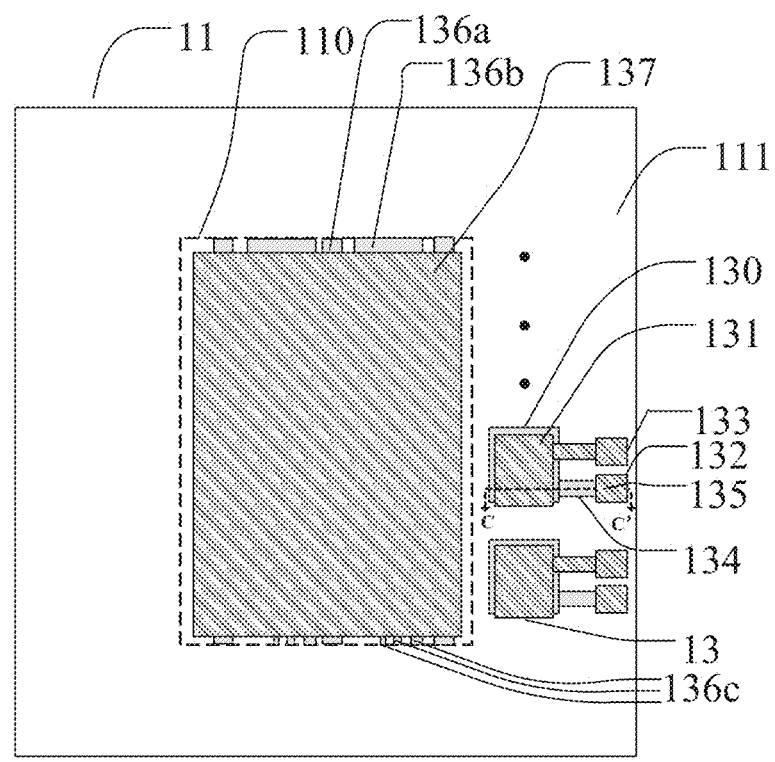
FIG. 11 is a plan view of a first substrate of the display device provided by another embodiment of the present invention.

FIG. 11 is a plan view of a first substrate of a display device provided by another embodiment of the present invention, and reference can be made to FIG. 9 for a sectional view taken along the line C-C' in FIG. 11. As can be apparent from both FIG. 11 and FIG. 9, the embodiment is different from the embodiment described in FIG. 3, that is, the display area 110 of the first substrate 11 of the display device further includes the first electrically conductive layer 136 and a second electrically conductive layer 137 disposed on the first electrically conductive layer 136, and the first insulation layer 113 is disposed between the first electrically conductive layer 136 and the second electrically conductive layer 137; and the first capacitor 13 including the first pole plate 130, the first insulation layer 113 and the second pole plate 131 is disposed in the non-display area 111 of the first substrate 11. In this embodiment, the first electrically conductive layer 136 is a single-layer touch electrode layer, and as illustrated in FIG. 11, the touch electrode layer includes a drive electrode 136a, a sense electrode 136b and an electrode lead 136c. The first electrically conductive layer 136 is disposed in the same layer as the first pole plate 130 and separates from the first pole plate 130, and the second electrically conductive layer 137 is a common electrode layer. The first electrically conductive layer 136 is disposed in the same layer as the first pole plate 130 and spatially and electrically separate from the first pole plate 130; and the second electrically conductive layer 137 is disposed in the same layer as the second pole plate 131 and spatially and electrically separate from the second pole plate 131. The materials of the first electrically conductive layer 136 and the first pole plate 130 can be Indium Tin Oxide (ITO), Indium Zinc Oxide (IZO), Indium Tin Zinc Oxide (ITZO), Antimony Tin Oxide (ATO), Silver (Ag), Gold (Au), Tungsten (W), Titanium (Ti), Molybdenum (Mo), etc.; and the materials of the second electrically conductive layer 137 and the second pole plate 131 can be Indium Tin Oxide (ITO), Indium Zinc Oxide (IZO), Indium Tin Zinc Oxide (ITZO), Antimony Tin Oxide (ATO), etc. In the foregoing embodiment, the second electrically conductive layer 137 can alternatively be an electrostatic shielding layer. In the embodiment, the first electrically conductive layer 136 and the first pole plate 130 can be fabricated in the same process, and the second electrically conductive layer 137 and the second pole plate 131 can be fabricated in the same process, so as to reduce the steps in fabrication process, save materials and reduce costs.

Figure 12:
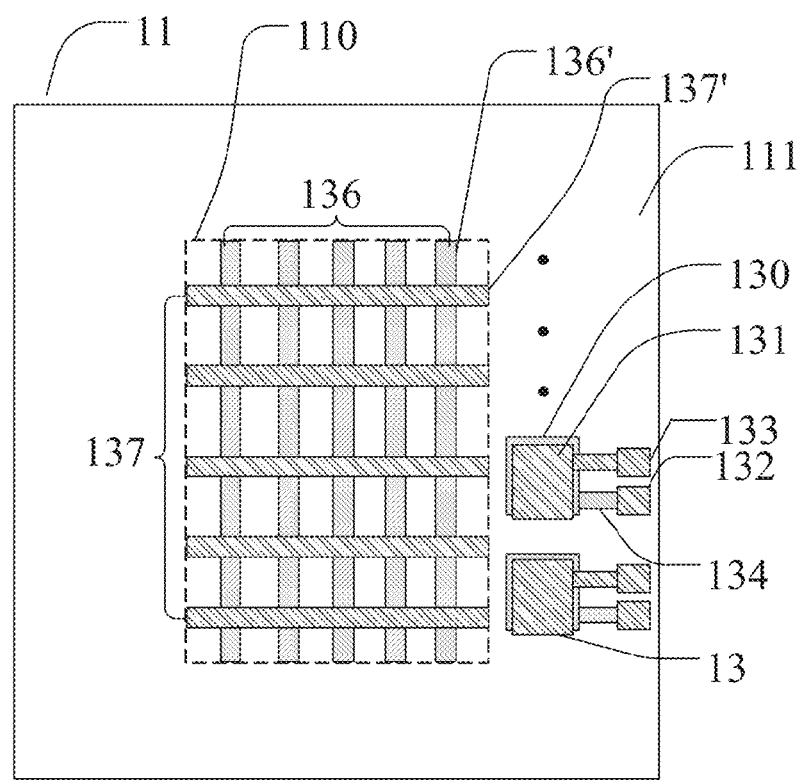
FIG. 12 is another plan view of the first substrate of the display device provided by another embodiment of the present invention.

The foregoing is merely one of implementations of an embodiment, and in an alternative implementation of the embodiment, as illustrated in FIG. 12, the first electrically conductive layer 136 and the second electrically conductive layer 137 of the display area 110 can alternatively be two touch electrode layers, wherein the first electrically conductive layer 136 includes a plurality of first touch electrode 136' extending in a first direction, and the second electrically conductive layer 137 includes a plurality of second touch electrode 137' extending in a second direction arranged perpendicular to the first direction. The first electrically conductive layer 136 is disposed in the same layer as the first pole plate 130 and separate from the first pole plate 130; and the second electrically conductive layer 137 is disposed in the same layer as the second pole plate 131 and separate from the second pole plate 131. The materials of the first electrically conductive layer 136, the second electrically conductive layer 137, the first pole plate 130 and the second pole plate 131 can be Indium Tin Oxide (ITO), Indium Zinc Oxide (IZO), Indium Tin Zinc Oxide (ITZO), Antimony Tin Oxide (ATO), Silver (Ag), Gold (Au), Tungsten (W), Titanium (Ti), Molybdenum (Mo), etc.; wherein the first pole plate and the second pole plate can be fabricated respectively in the same process as the two touch electrode layers to thereby reduce the steps in fabrication process, save the materials and reduce the cost.

In the embodiment, the single-layer touch electrode layers or the common electrode layers can be used as the first electrically conductive layer and the second electrically conductive layer, and the first electrically conductive layer and the second electrically conductive layer are disposed in the same layers as the two pole plates of the first capacitor respectively to thereby save the process steps and the materials and simplify the operations and also narrow the frame edge.

Figure 13:
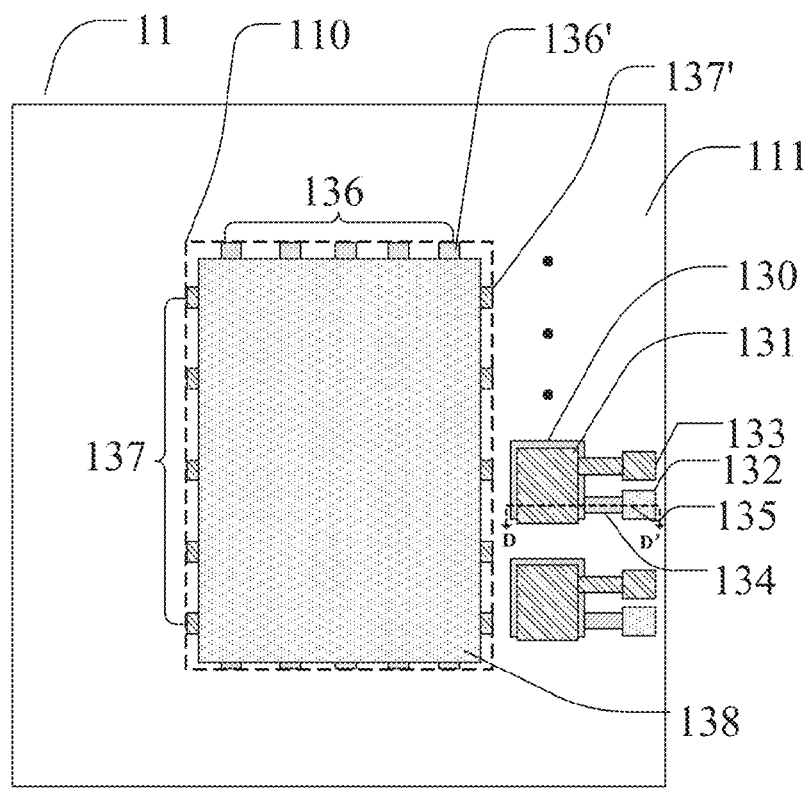
FIG. 13 is a plan view of a first substrate of the display device provided by another embodiment of the present invention.

FIG. 13 is a plan view of a first substrate of a display device provided by another embodiment of the present invention, and reference can be made to FIG. 9 for a sectional view taken along the line D-D' in FIG. 13. As can be apparent from both FIG. 13 and FIG. 9, the embodiment is different from the embodiment described in FIG. 3, that is, the display area 110 of the first substrate 11 of the display device further includes the first electrically conductive layer 136, the second electrically conductive layer 137 and a third electrically conductive layer 138, wherein the second electrically conductive layer 137 is disposed on the first electrically conductive layer 136, and the first insulation layer 113 is disposed between the first electrically conductive layer 136 and the second electrically conductive layer 137, and the third electrically conductive layer 138 is disposed on the second electrically conductive layer 137, and a second insulation layer 115 is disposed between the third electrically conductive layer 138 and the second electrically conductive layer 137. The first capacitor 13 including the first pole plate 130, the first insulation layer 113 and the second pole plate 131 is disposed in the non-display area 111 of the first substrate 11; and in the embodiment, the first electrically conductive layer 136 and the second electrically conductive layer 137 are two touch electrode layers, wherein the first electrically conductive layer 136 includes a plurality of first touch electrode 136' extending in a first direction, and the second electrically conductive layer 137 includes a plurality of second touch electrode 137' extending in a second direction arranged perpendicular to the first direction. The third electrically conductive layer 138 is a common electrode layer; the first pole plate 130 is disposed in the same layer as the first electrically conductive layer 136 and separate from the first electrically conductive layer 136; the second pole plate 131 is disposed in the same layer as the second electrically conductive layer 137 and separate from the second electrically conductive layer 137; the materials of the first pole plate 130, the first electrically conductive layer 136, the second pole plate 131 and the second electrically conductive layer 137 can be Indium Tin Oxide (ITO), Indium Zinc Oxide (IZO), Indium Tin Zinc Oxide (ITZO), Antimony Tin Oxide (ATO), Silver (Ag), Gold (Au), Tungsten (W), Titanium (Ti), Molybdenum (Mo), etc.; and the material of the third electrically conductive layer 138 can be Indium Tin Oxide (ITO), Indium Zinc Oxide (IZO), Indium Tin Zinc Oxide (ITZO), Antimony Tin Oxide (ATO), etc. The first electrically conductive layer 136 can be fabricated in the same process as the first pole plate 130 and the second electrically conductive layer 137 can be fabricated in the same process as the second pole plate 131 to thereby reduce the steps in fabrication process, save the materials and reduce the cost.

The foregoing is merely one of an embodiments, and the third electrically conductive layer 138 can alternatively be an electrostatic shielding layer; the first pole plate 130 and the second pole plate 131 can alternatively be disposed in the same layers as any two of the first electrically conductive layer 136, the second electrically conductive layer 137 and the third electrically conductive layer 138; and the two touch electrode layers can be any two adjacent ones of the first electrically conductive layer 136, the second electrically conductive layer 137 and the third electrically conductive layer 138.

Figure 14:
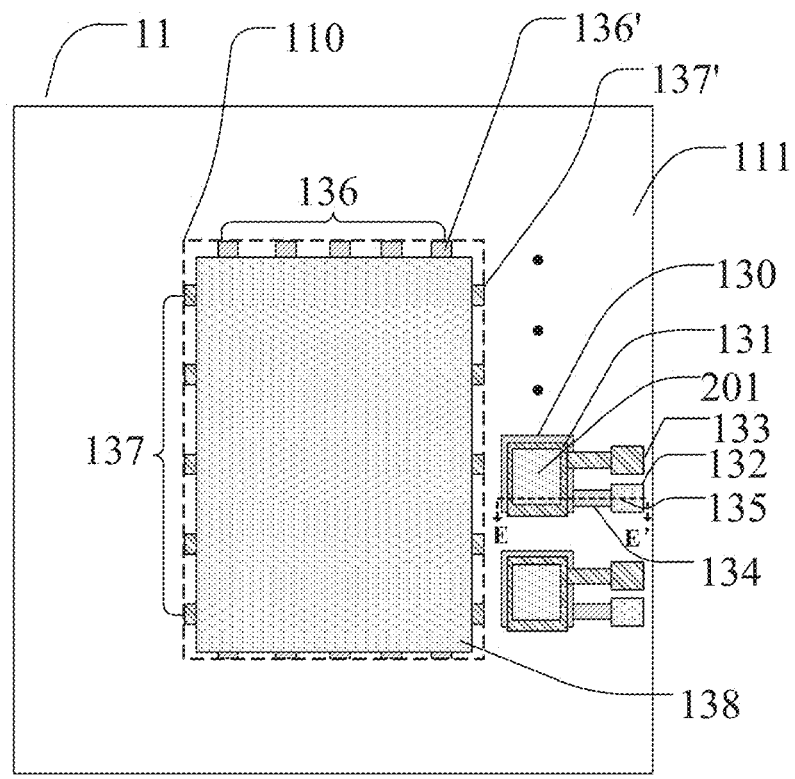
FIG. 14 is another plan view of a first substrate of the display device provided by another embodiment of the present invention.
Figure 15:
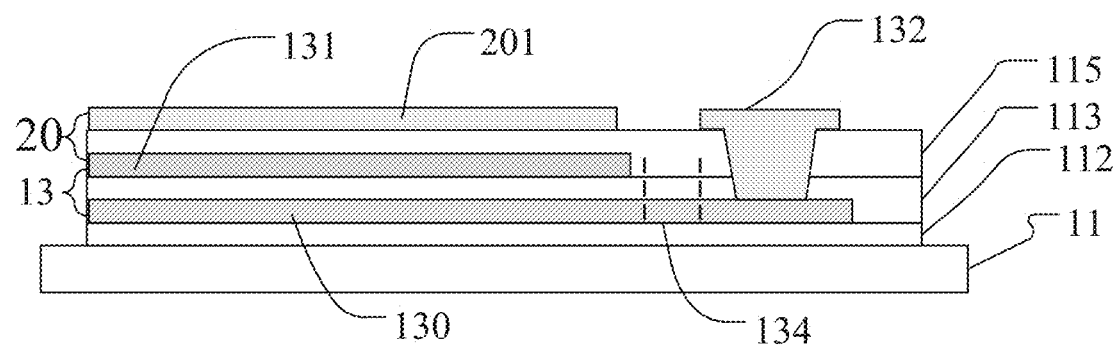
FIG. 15 is a sectional view taken along the line C-C' cross-section in FIG. 14.

FIG. 14 is another plan view of a first substrate of the display device provided by another embodiment of the present invention, and reference can be made to FIG. 15 for a sectional view taken along the line E-E' in FIG. 14. As can be apparent from both FIG. 14 and FIG. 15, a third pole plate 201 is disposed above the first capacitor 13 in the embodiment, wherein the third pole plate 201 and the second pole plate 131 constitute a second capacitor 20, and the third pole plate 201 is disposed in the same layer as the third electrically conductive layer 138 and separate from the third electrically conductive layer 138, wherein the capacitor connection line 134 is dotted in FIG. 15.

In the embodiment, the first electrically conductive layer 136 can be fabricated in the same process as the first pole plate 130, the second electrically conductive layer 137 can be fabricated in the same process as the second pole plate 131, and the third pole plate 201 can be fabricated in the same process as the third electrically conductive layer 138 to thereby reduce the steps in fabrication process, save the materials and reduce the cost.

The foregoing is merely one of implementations of an embodiment, and the third pole plate 201 can alternatively be disposed below the first pole plate 130, wherein the third pole plate 201 and the first pole plate 130 constitute the second capacitor 20.

In the embodiment, the display device can be disposed with three electrically conductive layers, and the first pole plate and the second pole plate can be disposed in the same layers as any two of the three electrically conductive layers to thereby save the process steps and the materials; and simplify the operations and also narrow the frame edge; and also the third pole plate can be disposed above or below the first capacitor to constitute the second capacitor together with the first pole plate or the second pole plate; and the two capacitors can be connected in series to thereby increase the capacitance value of the first capacitor.

Figure 16:
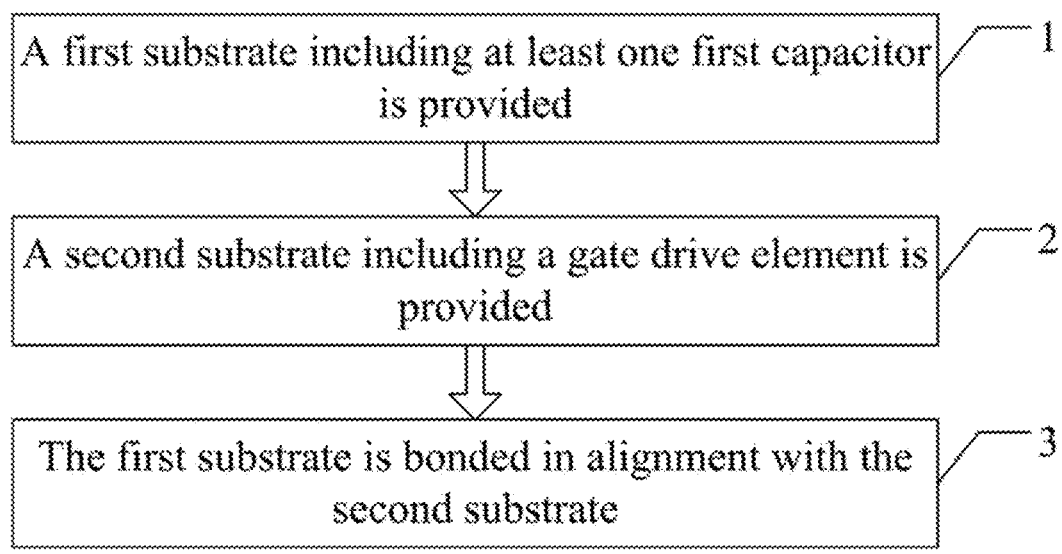
FIG. 16 is a schematic flow chart of a method for manufacturing a display device provided by another of the present invention.

An embodiment of the present invention provides a method for manufacturing a display device, and referring to FIG. 16, there is a simplified flow chart of the method for manufacturing a display device provided by another embodiment of the present invention. The method includes the following steps:

Step 1, a first substrate including at least one first capacitor (referred to as the first capacitor) is provided.

Step 1 may include forming the first capacitor on the first substrate. A black matrix is formed on the first substrate, and a first electrically conductive material layer is formed on the black matrix; the first electrically conductive material layer is patterned to form a first pole plate of the first capacitor and a capacitor connection line, wherein the capacitor connection line is electrically connected with the first pole plate; a first insulation layer is formed on the first pole plate and the capacitor connection line; the first insulation layer is patterned to form a first via hole; a second electrically conductive material layer is formed on the first insulation layer; and the second electrically conductive material layer is patterned to form a second pole plate of the first capacitor, a first connection pad and a second connection pad, wherein the second connection pad is electrically connected with the first pole plate through the first via hole. FIG. 3 illustrates a plan view of the first capacitor formed on the first substrate, and FIG. 5a illustrates a sectional view of the first capacitor.

Alternatively, step 1 may include: the first electrically conductive material layer is patterned to form a touch electrode layer, wherein reference can be made to FIG. 8 for a plan view of the first substrate; or by patterning the first electrically conductive material layer to form a common electrode layer, wherein reference can be made to FIG. 10 for a plan view of the first substrate; or by patterning the first electrically conductive material layer to form an electrostatic shielding layer.

In an alternative embodiment of the present invention, forming the first capacitor on the first substrate may include: the first electrically conductive material layer is patterned to form a touch electrode layer and the second electrically conductive material layer is patterned to form a common electrode layer, wherein reference can be made to FIG. 11 for a plan view of the first substrate; and in the embodiment, the second electrically conductive material layer can be further patterned to form an electrostatic shielding layer; or in an implementation of the embodiment, in the step of forming the first capacitor on the first substrate, the first electrically conductive material layer is patterned to form a touch electrode layer, and the second electrically conductive material layer is patterned to form a touch electrode layer, wherein reference can be made to FIG. 12 for a plan view of the first substrate.

In another embodiment of the present invention, forming the first capacitor on the first substrate may include: the first electrically conductive material layer is patterned to form a first touch electrode layer, and the second electrically conductive material layer is patterned to form a second touch electrode layer. In the embodiment, a second capacitor can be formed below the first capacitor, wherein the second capacitor is formed particularly as follows: before the first electrically conductive material layer is patterned to form the first touch electrode layer, a third electrically conductive material layer is formed on the first substrate; and the third electrically conductive material layer is patterned to form a third pole plate and a common electrode layer, and a second insulation layer is formed on the third pole plate; wherein the third pole plate and the first pole plate constitute the second capacitor. The common electrode layer here can alternatively be an electrostatic shielding layer. Alternatively the second capacitor can be formed above the first capacitor, wherein the second capacitor is formed particularly as follows: after the second electrically conductive material layer is patterned to form the second touch electrode layer, a third electrically conductive material layer is formed on the second electrically conductive material layer; and the third electrically conductive material layer is patterned to form a third pole plate and a common electrode layer, and a second insulation layer is formed on the third pole plate;

wherein the third pole plate and the second pole plate constitute the second capacitor, and reference can be made to FIG. 14 for a plan view of the first substrate.

Particularly, the first pole plate and the capacitor connection line are formed on the first substrate as follows: electrically conductive material and a photo resist layer are coated sequentially on the first substrate, the first substrate is illuminated by ultraviolet light in a specific area using a specific photomask respectively after coating the electrically conductive material layer and coating the photo resist layer on the first substrate, that is, the substrate coated sequentially with the electrically conductive material layer and the photo resist layer is exposed, and the exposed substrate is developed, wherein the specific photomask is opened at a specific location according to the characteristic of the photo resist layer so that if the photo resist layer is negative photo resist, the photo resist layer illuminated by ultraviolet light in the specific open area will not be removed in development thereof; and if the photo resist layer is positive photo resist, the photo resist layer illuminated by UV (Ultraviolet Light) in the specific open area will be removed in development thereof.

The insulation layer is formed on the first pole plate and the capacitor connection line particularly as follows: the insulation material is coated on the substrate disposed with the first pole plate and the capacitor connection line, and the insulation material coated on the substrate is hardened to form the insulation layer on the first pole plate and the capacitor connection line, wherein the insulation layer can be hardened by being baked or UV-illuminated or in any applicable hardening scheme.

The second pole plate, the first connection pad and the second connection pad are formed on the insulation layer in the same particular process steps as those in which the first pole plate is manufactured except for the different patterns which can be manufactured into different shapes using different selected photomasks.

Step 2, a second substrate including a gate drive element is provided.

In the step of forming the gate drive element on the second substrate, a third insulation layer is formed on the gate drive element, and the third insulation layer is patterned to form a second via hole; and a fourth electrically conductive material layer is formed on the third insulation layer, and the fourth electrically conductive material layer is patterned to form a third connection pad; wherein the third connection pad is electrically connected with the gate drive element via the second via hole, and reference can be made to FIG. 4 for a plan view of the second substrate.

Step 3, the first substrate is bonded in alignment with the second substrate.

A sealant is coated in a non-display area of the first substrate, particularly in the corresponding location between the first capacitor and the gate drive element. The sealant doped with electrically conductive gold metals is electrically conductive. The second substrate is bonded in alignment with the first substrate, and the electrically conductive gold metals in the sealant are pressed into contact with each other to electrically connect the first capacitor together with the gate drive element.

While embodiments have been presented in the foregoing detailed description of the present invention, it should be appreciated that various variations exist. Those ordinarily skilled in the art can make variations to the particular embodiments and their application scopes without departing from the scope of the present invention. In summary the disclosure of this specification shall not be comprehended as limiting the scope of the present invention.

What is claimed is:

1. A method for manufacturing a display device, comprising:
   providing a first substrate;
   forming a first capacitor on the first substrate;
   providing a second substrate having a gate drive element formed thereon; and
   bonding the first substrate in alignment with the second substrate;
   wherein forming the gate drive element on the second substrate comprises:
      forming a third insulation layer on the gate drive element, and patterning the third insulation layer to form a second via hole; and
      forming a fourth electrically conductive material layer on the third insulation layer, and patterning the fourth electrically conductive material layer to form a third connection pad, wherein the third connection pad is electrically connected with the gate drive element through the second via hole.

2. The method according to claim 1, wherein forming the first capacitor on the first substrate comprises:
   forming a first electrically conductive material layer on the first substrate;
   patterning the first electrically conductive material layer to form a first pole plate of the first capacitor;
   forming a first insulation layer on the first pole plate and a capacitor connection line;
   patterning the first insulation layer to form a first via hole;
   forming a second electrically conductive material layer on the first insulation layer; and
   patterning the second electrically conductive material layer to form a second pole plate of the first capacitor, a first connection pad and a second connection pad, wherein the second connection pad is electrically connected with the first pole plate through the first via hole.

3. The method according to claim 2, further comprising: patterning the first electrically conductive material layer or patterning the second electrically conductive material layer to form a touch electrode layer or a common electrode layer.

4. The method according to claim 2, further comprising: patterning the first electrically conductive material layer to form a first touch electrode layer; and patterning the second electrically conductive material layer to form a second touch electrode layer.

5. The method according to claim 4, further comprising, before patterning the first electrically conductive material layer: forming a third electrically conductive material layer on the first substrate; patterning the third electrically conductive material layer to form a third pole plate and a common electrode layer; and forming a second insulation layer on the third pole plate and a second capacitor comprising the third pole plate and the first pole plate.

6. The method according to claim 4, further comprising, after patterning the second electrically conductive material layer: forming a third electrically conductive material layer on the second electrically conductive material layer; patterning the third electrically conductive material layer to form a third pole plate and a common electrode layer; and forming a second insulation layer on the third pole plate and a second capacitor comprising the third pole plate and the second pole plate.

* * * * *